(12) United States Patent
Sato et al.

(10) Patent No.: US 11,242,929 B2
(45) Date of Patent: Feb. 8, 2022

(54) PISTON RING

(71) Applicant: TPR Co., Ltd., Tokyo (JP)

(72) Inventors: Tomoyuki Sato, Tokyo (JP); Yutaka Kitazume, Tokyo (JP); Takatsugu Iwashita, Tokyo (JP)

(73) Assignee: TPR Co., Ltd., Tokyo (JP)

( * ) Notice: Subject to any disclaimer, the term of this patent is extended or adjusted under 35 U.S.C. 154(b) by 0 days.

(21) Appl. No.: 17/254,546

(22) PCT Filed: Jun. 13, 2019

(86) PCT No.: PCT/JP2019/023500
§ 371 (c)(1),
(2) Date: Dec. 21, 2020

(87) PCT Pub. No.: WO2020/004061
PCT Pub. Date: Jan. 2, 2020

(65) Prior Publication Data
US 2021/0270370 A1 Sep. 2, 2021

(30) Foreign Application Priority Data

Jun. 29, 2018 (JP) .............................. JP2018-123839
Jun. 12, 2019 (JP) .............................. JP2019-109157

(51) Int. Cl.
*F16J 9/26* (2006.01)
*C23C 14/06* (2006.01)
(Continued)

(52) U.S. Cl.
CPC .............. *F16J 9/26* (2013.01); *C23C 14/0611* (2013.01); *F02F 5/00* (2013.01); *F16J 9/22* (2013.01); *F16J 9/28* (2013.01)

(58) Field of Classification Search
CPC ......... F16J 9/26; F16J 9/22; F16J 9/28; C23C 14/0611; F02F 5/00; F04B 2201/0205; F05D 2240/58
See application file for complete search history.

(56) References Cited

U.S. PATENT DOCUMENTS 10,847,730 B2 * 11/2020 Furuie ................ H01L 27/3244
2008/0074371 A1   3/2008 Tajiri
(Continued)

FOREIGN PATENT DOCUMENTS

EP        2754730 A1    7/2014
JP        2007-284760 A  11/2007
(Continued)

OTHER PUBLICATIONS

Decision on Refusal in corresponding Japanese Patent Application No. 2018-123839 dated Feb. 4, 2020.
(Continued)

*Primary Examiner* — Syed O Hasan
(74) *Attorney, Agent, or Firm* — Marshall, Gerstein & Borun LLP

(57) ABSTRACT

The present invention addresses the problem of providing a piston ring covered with a DLC coating that has excellent wear resistance and shows a low attacking property on a cylinder bore sliding surface. The problem is solved by a piston ring which is used in the presence of an engine lubricating oil and includes a DLC coating on an outer peripheral sliding surface. The DLC coating has an $sp^2$ component ratio of 0.5 to 0.85 as determined from a TEM-EELS spectrum obtained by a combination of a transmission electron microscope (TEM) and electron energy loss spectroscopy (EELS), as well as a coating hardness of 12 GPa to 26 GPa and a Young's modulus of 250 GPa or less as measured by a nanoindentation method.

7 Claims, 10 Drawing Sheets

(51) Int. Cl.
   *F02F 5/00*  (2006.01)
   *F16J 9/22*  (2006.01)
   *F16J 9/28*  (2006.01)

(56) References Cited

U.S. PATENT DOCUMENTS

| | | | |
|---|---|---|---|
| 2008/0220257 A1 | 9/2008 | Dekempeneer | |
| 2012/0248711 A1* | 10/2012 | Iwashita | F16J 9/26 277/444 |
| 2015/0136062 A1 | 5/2015 | Tsuji et al. | |
| 2016/0003356 A1* | 1/2016 | Ozaki | C23C 14/0605 277/443 |
| 2016/0215882 A1 | 7/2016 | Shima et al. | |
| 2016/0245407 A1 | 8/2016 | Honda et al. | |
| 2017/0002454 A1 | 1/2017 | Ozaki et al. | |
| 2018/0180181 A1 | 6/2018 | Ozaki et al. | |
| 2018/0187781 A1 | 7/2018 | Moronuki | |
| 2019/0360585 A1 | 11/2019 | Kawano et al. | |
| 2020/0284345 A1 | 9/2020 | Shinohara | |
| 2020/0292076 A1 | 9/2020 | Deng | |

FOREIGN PATENT DOCUMENTS

| | | |
|---|---|---|
| JP | 2008-076958 A | 4/2008 |
| JP | 5424103 B2 | 2/2014 |
| JP | 2014-88024 A | 5/2014 |
| JP | 2014-091844 A | 5/2014 |
| JP | 5575989 B2 | 8/2014 |
| JP | 2016-37637 A | 3/2016 |
| JP | 5900754 B2 | 4/2016 |
| JP | 6181905 B1 | 8/2017 |
| JP | 6251850 B1 | 12/2017 |
| JP | 2018-003880 A | 1/2018 |
| JP | 2018-76958 A | 5/2018 |
| JP | 6357606 B1 | 7/2018 |
| JP | 6357607 B1 | 7/2018 |
| JP | 2019-082241 A | 5/2019 |
| WO | WO-2014/133095 A1 | 9/2014 |
| WO | WO-2015/023002 A1 | 2/2015 |
| WO | WO-2015/115601 A1 | 8/2015 |
| WO | WO-2016/021671 A1 | 2/2016 |
| WO | WO-2017/022660 A1 | 2/2017 |

OTHER PUBLICATIONS

International Application No. PCT/JP2019/023500, International Search Report, dated Jul. 23, 2019.
Office Action in corresponding Japanese Patent Application No. 2018-123839 dated Nov. 12, 2019.
Office Action in corresponding Japanese Patent Application No. 2019-109157 dated Aug. 6, 2019.
Office Action in corresponding Japanese Patent Application No. 2019-109157 dated Nov. 12, 2019.
Japanese Patent Application No. 2019-109157, Decision to Grant a Patent, dated Jan. 28, 2020.
Opposition to the Grant of Patent in JPB Patent No. 6669922 dated Sep. 17, 2020, 52 pages.
Moriguchi et al., "Tribological Properties of New Type DLC Film "Geniuscoat HAM"", The Nissin Electric Review, vol. 62, No. 2, 2017, pp. 30-35.
Miyake et al., "Development of Diamond Like Carbon (DLC) Films for Automotive Engine Parts", The Nissin Electric Review, vol. 62, No. 3, 2017, pp. 45-49.
Miyake et al., "Characteristics and Applications of Diamond Like Carbon (DLC) Films", J. Vac. Soc. Jpn., vol. 60, No. 11, 2017, pp. 428-436.
Hiratsuka et al., "Correlation Between Optical Properties and Hardness of Diamond-Like Carbon Films", Journal of Solid Mechanics and Materials Engineering, vol. 7, No. 2, 2013, pp. 187-198.
Office Action in IN Application No. 202017053393 dated Mar. 30, 2021, 5 pages.

* cited by examiner

PISTON RING

TECHNICAL FIELD

The present invention relates to a piston ring used on a piston for an internal combustion engine.

BACKGROUND ART

The outer peripheral sliding surface of a piston ring used on a piston for an internal combustion engine may be covered with a DLC (diamond-like carbon) coating, and various developments have been made. Generally, a DLC coating is a coating having an amorphous structure (non-crystalline structure) in which $sp^2$ bonds of carbon atoms corresponding to a graphite structure and sp3 bonds of carbon atoms corresponding to a diamond structure coexist. A DLC coating has graphite-like physical properties (solid lubricity with a low frictional coefficient) when the $sp^2$ component ratio ($sp^2/(sp^2+sp^3)$) is high, or diamond-like physical properties (excellent in hardness, wear resistance, and chemical stability) when the $sp^3$ component ratio ($sp^3/(sp^2+sp^3)$) is high; therefore, a DLC coating having various properties can be formed by adjusting these component ratios.

Patent Document 1 discloses a sliding member having a graded composition in which the $sp^2$ ratio increases from the inner surface side of an amorphous hard carbon film, which is the base material side, toward the outer surface side, and the value of (B−A) is 20 or larger when the $sp^2$ ratio of the amorphous hard carbon film on the inner surface side is defined as A % and that on the outer surface side is defined as B %. It is mentioned that the $sp^2$ ratio A and the $sp^2$ ratio B are preferably lower than 40% and higher than 65%, respectively, and that the amorphous hard carbon film has excellent adhesion with the base material as long as the density of 300 μm² or larger droplets existing on the surface of the amorphous hard carbon film is 600 droplets/mm² or less, as a result of which cracking of the coating and peeling of the surface layer can be inhibited and excellent wear resistance can be attained.

In Patent Document 1, the "$sp^2$ ratio", which represents the ratio of $sp^2$ bonds with respect to the $sp^2$ and $sp^3$ bonds contained in the amorphous hard carbon film ($sp^2/(sp^2+sp^3)$), means a value that is calculated based on a spectrum obtained by electron energy loss spectroscopy (EELS). Further, the term "droplets" refers to recesses or protrusions that are formed on the surface of the amorphous hard carbon film due to incorporation or omission of droplet particles, and it is stated that the density of droplets can be determined by visually counting, under a microscope, the number of 300 μm² or larger recesses or protrusions existing in a prescribed area of the surface that are formed by incorporation or omission of droplet particles; and that, of course, the counting may be performed by image processing or the like as well.

A relatively low $sp^2$ ratio on the base material side means that the amorphous hard carbon film has a relatively high strength in the vicinity of the base material. By this, peeling of the coating, which is caused by destruction of the coating that occurs due to the load applied to the coating in the vicinity of its interface with the base material during high-load sliding, can be inhibited. In addition, even when a soft base material is used, deformation of the base material is reduced, so that peeling of the coating caused by the deformation can be inhibited. In other words, sufficient adhesion can be ensured between the amorphous hard carbon film and the base material. On the other hand, a relatively high $sp^2$ ratio on the outer surface side means that the carbon atoms have a relatively weak bond strength, i.e., the coating is flexible. For example, when foreign matters generated by sliding, such as wear debris and dust, pass through the sliding surface, the surface of the coating acts as a cushion, so that cracking and peeling of the coating can be inhibited.

Patent Document 2 discloses a sliding member provided with an amorphous hard carbon film formed on at least one sliding surface, wherein the amorphous hard carbon film is a carbon layer whose Young's modulus continuously and/or stepwisely decreases from a base material of the sliding member toward the surface, and the carbon layer has a hydrogen concentration of lower than 5% by atom. Further, Patent Document 2 states that the carbon layer preferably has a Young's modulus of higher than 400 GPa in the portion of at least 0.5 μm in thickness from the base material side and a Young's modulus of 350 GPa or lower in the portion of at least 1.5 μm in thickness from the surface toward the inside, and it is mentioned that excellent wear resistance and peeling resistance are attained because of these Young's modulus values.

RELATED ART DOCUMENTS

Patent Documents

[Patent Document 1] Japanese Patent No. 6357606
[Patent Document 2] Japanese Unexamined Patent Application Publication No. 2018-003880

SUMMARY OF THE INVENTION

Problems to be Solved by the Invention

Various developments have been made for DLC coatings and, it is required that a DLC coating does not cause wear on the sliding surface of a cylinder bore, i.e., has a low attacking property against the cylinder bore sliding surface (low attacking property against counterpart members), in addition to having an improved wear resistance and maintaining a low friction.

In association with the travel of an automobile, sediments called deposits are generated inside the engine of the automobile. The deposits are usually sediments of, for example, incomplete combustion products of fuel and engine lubricating oil. For improvement of the fuel economy in recent years, in gasoline-powered engines as well, exhaust gas recirculation (EGR) systems which recirculate exhaust gas into the combustion chambers have been introduced and direct-injection systems have been adopted and, consequently, the amount of deposits dissolving into an engine lubricating oil tends to be increased.

Further, in combustion gas, for example, oxides and carbides coexist in addition to hydrocarbons originating from unburned fuel, and deposits are also generated from these substances and remain in the engine lubricating oil.

The deposits contained in the engine lubricating oil exist in a sliding region between a piston ring and a cylinder bore and form a sliding environment that causes abrasive wear. In other words, as compared to a sliding environment where the engine lubricating oil is clean and the deposit generation is limited, abrasive wear between the piston ring and the cylinder bore is facilitated in an environment where the engine lubricating oil has been deteriorated.

An object of the present invention is to provide a piston ring covered with a DLC coating which has excellent wear resistance with a sufficient effect also against the above-described abrasive wear and shows a low attacking property on a cylinder bore sliding surface.

Means for Solving the Problems

The present inventors intensively studied to achieve the above-described object and consequently discovered that a DLC coating, which has excellent wear resistance and shows a low attacking property on counterpart members, can be obtained by controlling the $sp^2$ component ratio, as well as the coating hardness and the Young's modulus that are measured by a nanoindentation method, to be each in a specific range, thereby completing the present invention.

The present invention is a piston ring which is used in the presence of an engine lubricating oil and has a DLC coating on an outer peripheral sliding surface, wherein the DLC coating has an $sp^2$ component ratio of 0.5 to 0.85 as measured by TEM-EELS using a transmission electron microscope (TEM) in combination with electron energy loss spectroscopy (EELS), as well as a coating hardness of 12 GPa to 26 GPa and a Young's modulus of 250 GPa or less as measured by a nanoindentation method.

The DLC coating preferably has a Young's modulus of 200 GPa or less, and the number of macroparticles in the DLC coating, which is observed in a ×10,000 image of a cross-section of the DLC coating that is taken along the thickness direction under a scanning electron microscope (SEM), is preferably 2 or less per 10 μm².

Further, it is preferred that the DLC coating have a refractive index of 2.3 to 2.6 at a wavelength of 550 nm as measured by a spectroscopic ellipsometer, a coating hardness of 20 GPa or less, an underlayer containing Ti, Cr, or Si, and a film thickness of 1 μm or greater.

Effects of the Invention

According to the present invention, a piston ring covered with a DLC coating which has excellent wear resistance with a sufficient effect against abrasive wear and shows a low attacking property on a cylinder bore sliding surface can be provided.

MODE FOR CARRYING OUT THE INVENTION

The present invention will now be described referring to specific embodiments; however, the below-described embodiments are provided as examples of the present invention and do not necessarily specify the inventions described in claims, and not all of the features described in the embodiments are indispensable to the means for solving the problems of the present invention.

Figure 1:
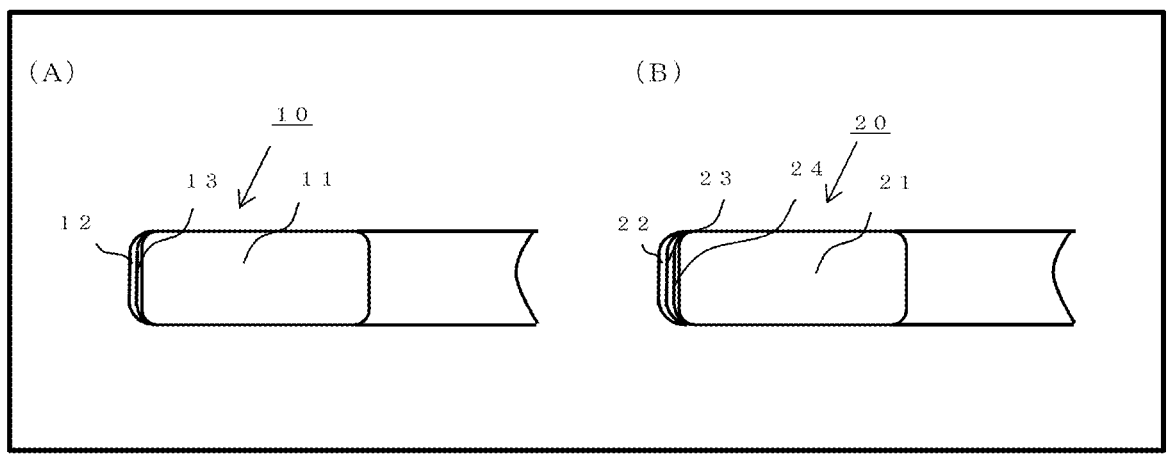
FIG. 1(A) shows a schematic cross-sectional view of a piston ring in which a DLC coating having an underlayer is formed on a piston ring base material.
FIG. 1(B) shows a schematic cross-sectional view of a piston ring in which a DLC coating having an underlayer is formed on a piston ring base material having a base layer.

A piston ring 10 of the present embodiment illustrated in FIG. 1(A) is fitted in a piston ring groove (not illustrated) formed on a piston, and moves in a reciprocating manner along with the reciprocating motion of the piston while sliding on an inner peripheral surface of a cylinder bore (not illustrated).

The piston ring 10 of the present embodiment can be used as any of a top ring, a second ring, and an oil ring. When the piston ring 10 is used as an oil ring, the piston ring 10 can be applied to any of an oil ring main body of an oil ring having a two-piece configuration consisting of the oil ring main body and a coil expander, and a segment of an oil ring having a three-piece configuration consisting of two segments (also referred to as "side rails") and an expander-spacer.

The piston ring 10 of the present embodiment is preferably fitted on a piston made of an aluminum alloy and used as a piston ring against a cylinder bore made of cast iron.

A piston ring base material 11 is not particularly restricted as long as it is a material that is conventionally used as a piston ring base material. For example, a stainless steel material or a steel material can be suitably used and, specifically, martensitic stainless steel, silicon-chromium steel or the like is preferably used.

The piston ring 10 illustrated in FIG. 1(A) includes: an underlayer 13, which contains Cr, Ti or Si, on a smoothed outer peripheral surface of the piston ring base material 11; and a DLC coating 12 on the underlayer 13. By incorporating the underlayer 13, the adhesion between the DLC coating 12 and the piston ring base material 11 can be improved.

The underlayer 13 has a film thickness of preferably 0.2 μm to 1.0 μm. By controlling the film thickness in this range, the adhesion between the DLC coating 12 and the piston ring base material 11 can be further improved. It is noted here that the DLC coating 12 may be formed directly on the smoothed outer peripheral surface of the piston ring base material 11, without the underlayer 13 therebetween.

A method of smoothing the outer peripheral surface of the piston ring base material 11 prior to the formation of the DLC coating 12 is not particularly restricted; however, it is preferred to adjust the surface roughness by grinding or buffing. The surface roughness of the piston ring base material 11 is preferably adjusted to be 0.5 μm or less in terms of maximum height Rz prescribed in JIS B0601 (2001).

In another mode, a piston ring 20 illustrated in FIG. 1(B) includes a base layer 24 between an underlayer 23 and a piston ring base material 21. The base layer 24 can be selected from a PVD coating, a Cr-plated coating, and a nitrided layer. By arranging the base layer 24, the adhesion between the piston ring base material 21 and a DLC coating 24 can be further improved. The thickness of the base layer 24 is not particularly restricted; however, it is preferably 0.2 μm to 1.0 μm.

In the DLC coating 12 used in the present embodiment, the $sp^2/(sp^2+sp^3)$ composition ratio (hereinafter, also simply referred to as "$sp^2$ component ratio"), which is determined by TEM-EELS using a transmission electron microscope (TEM) in combination with electron energy loss spectroscopy (EELS), may be 0.5 to 0.85, preferably 0.5 to 0.8. With the $sp^2$ component ratio being lower than 0.5 (50%), since the coating hardness is high, the wear resistance of the DLC coating is reduced by abrasive wear when deposits and foreign matters generated by sliding, such as wear debris and dust, pass through the sliding surface. In addition, an increase in the internal stress is likely to induce peeling inside the DLC coating. When the $sp^2$ component ratio is higher than 0.85 (85%), since the bonding strength of carbon atoms is weak and the coating hardness is thus low, the wear resistance of the DLC coating against sliding is insufficient. The $sp^2$ component ratio may be 0.55 or higher, 0.60 or higher, 0.65 or higher, or 0.70 or higher.

Generally speaking, a DLC coating has graphite-like physical properties when the $sp^2$ component ratio ($sp^2/(sp^2+sp^3)$) is high, or diamond-like physical properties when the $sp^3$ component ratio ($sp^3/(sp^2+sp^3)$) is high; therefore, a DLC coating having various properties can be prepared by adjusting these component ratios.

[Measurement of $sp^2$ Component Ratio]

The $sp^2$ component ratio is measured using a TEM (field-emission transmission electron microscope JEM-2100F, manufactured by JEOL Ltd.) and an EELS (Model 863GIF Tridiem, manufactured by Gatan, Inc.).

The procedure for measuring the $sp^2$ component ratio by TEM-EELS is as follows.

(1) An EELS spectrum is measured using an EELS analyzer. For the thus obtained EELS spectrum, the peak intensity is normalized by fitting a pre-peak region with a linear function and a post-peak region with a cubic function.

(2) Subsequently, comparing the data of diamond and the data of graphite, the peak start position is aligned to calibrate the energy value.

(3) For the thus calibrated data, a total area in a range of 280 eV to 310 eV is determined.

(4) In order to isolate the $sp^2$ peak component, peak separation is performed assuming that there are two peaks in a range of 280 eV to 295 eV ($\pi^*$ peak of $sp^2$ and $\sigma^*$ peak containing CH and amorphous peaks), and the area of the peak around 285 eV is determined ($sp^2$ peak area).

(5) A ratio of the area determined in the above (4) with respect to the area determined in the above (3) ($sp^2$ peak area ratio) is calculated. For this area ratio, the ratio of $sp^2$ is determined from relative values, taking values of graphite and diamond as 100 and 0, respectively. The thus obtained value is defined as the $sp^2$ component ratio.

The measurement value is defined an average of three measured values extracted from a coating cross-section at each of three spots along the circumferential direction of a single piston, which are at a position on the opposite side of a gap of the piston ring and at 90° positions relative to the gap on the respective sides.

The DLC coating 12 used in the present embodiment preferably has a hardness of 12 GPa to 26 GPa as measured by a nanoindentation method. A low coating hardness of less than 12 GPa is not preferred since it makes the wear resistance of the DLC coating insufficient. A coating hardness of higher than 26 GPa is also not preferred since, when the piston ring is used with an engine lubricating oil that has been used for traveling over a long distance, a sliding environment causing abrasive wear facilitates wear of the DLC coating. In an environment where abrasive wear may occur, the wear of the DLC coating itself and that of a counterpart member are increased in proportion to the hardness of the DLC coating.

Further, the DLC coating 12 preferably has a Vickers hardness of 1,000 HV to 2,000 HV, and the Vickers hardness may be 1,700 or less, or 1,500 HV or less. Usually, considering the wear resistance, a higher coating hardness is more preferred; however, in the present embodiment, the Vickers hardness is preferably controlled not to be overly high in the above-described range since not only an excessively high coating hardness tends to increase the attack against a cylinder bore sliding surface, but also the DLC coating is formed on the outer peripheral surface of a piston ring and is thus broken at the time of an operation involving deformation, such as fitting on a piston.

[Measurement of Vickers Hardness]

For the measurement of Vickers hardness, the indentation hardness is measured using a nanoindentation analyzer (model: HM-2000, manufactured by Fischer Instruments K.K.) along with a Vickers indenter at an indentation load of 500 mN with the time before reaching a maximum indentation load being set at 30 s (seconds).

The measurement value is defined an average of three measured values extracted from a coating surface at each of three spots along the circumferential direction of a single piston, which are at a position on the opposite side of a gap of the piston ring and at 90° positions relative to the gap on the respective sides.

[Measurement of Nanoindentation Hardness]

For the measurement of hardness by a nanoindentation method, the indentation hardness is measured using a nanoindentation analyzer (model: HM-2000, manufactured by Fischer Instruments K. K.) along with a Vickers indenter at an indentation load of 500 mN with the time before reaching a maximum indentation load being set at 30 s (seconds).

The measurement value is defined an average of three measured values extracted from a coating surface at each of three spots along the circumferential direction of a single piston, which are at a position on the opposite side of a gap of the piston ring and at 90° positions relative to the gap on the respective sides.

In a sliding environment where deposits exist between the DLC coating on the outer peripheral surface of a piston ring and a cylinder bore, i.e., when the piston ring is used with an engine lubricating oil that has been used for traveling over a long distance, a higher surface hardness of the DLC coating leads to an increased wear the DLC coating. Taking this into consideration, the hardness of the coating surface is more preferably 12 GPa to 22 GPa, still more preferably 12 GPa to 20 GPa, particularly preferably 12 GPa to 18 GPa.

The DLC coating 12 used in the present embodiment has a Young's modulus of preferably 250 GPa or less, more preferably 200 GPa or less, still more preferably 180 GPa or less, as measured by a nanoindentation method. With the Young's modulus being higher than 250 GPa, brittle fracture appears on the outermost layer of the DLC coating and the wear is increased when deposits and foreign matters generated by sliding, such as wear debris and dust, pass through the DLC coating surface. Meanwhile, a lower limit is not particularly restricted; however, a Young's modulus of 120 GPa or higher makes peeling inside the coating unlikely to occur.

[Measurement of Young's Modulus]

The measurement of Young's modulus by a nanoindentation method is carried out using a nanoindentation analyzer (model: HM-2000, manufactured by Fischer Instruments K.K.) along with a Vickers indenter at an indentation load of 500 mN with the time before reaching a maximum indentation load being set at 30 s (seconds). The Young's modulus is determined from a load-indentation depth curve. It is noted here that the measurement value is defined as an average of four measured values obtained in the same manner as in the measurement of nanoindentation hardness.

In the DLC coating 12 used in the present embodiment, the number of macroparticles, which is observed in an image (cross-sectional SEM image) of a thickness-wise cross-section of the coating (a cross-section perpendicular to the circumferential direction of the piston ring) that is taken at a magnification of ×10,000 under a scanning electron microscope (SEM), is preferably 2 or less per 10 $\mu m^2$, more preferably 1.5 or less per 10 $\mu m^2$. By controlling the number of macroparticles to be 2 or less per 10 $\mu m^2$, the generation of surface defects and the formation of surface irregularities can be inhibited, so that the attack against a counterpart can be reduced.

The macroparticles observed at a cross-section of the DLC coating will now be described referring to the ×10,000 cross-sectional SEM images shown in FIGS. 2 to 5.

FIG. 2(A) shows one example of a cross-sectional SEM image taken immediately after the formation of the DLC coating of one embodiment (the below-described Example 3), and FIG. 2(B) is a drawing that schematically illustrates the image of FIG. 2(A) for describing a macroparticle portion.

In FIG. 2(A), originating from a macroparticle (arrow a), a single V-shaped interface (indicated by an arrow b in FIG. 2(B)) expanding toward the coating surface (arrow d) is formed inside the circled area in the center of the image, and a bump (arrow c) protruding to the outside is formed on the coating surface (arrow d). It is shown that this macroparticle is formed in the early stage after the start of the coating formation, and that the V-shaped interface originating from the macroparticle continues to grow until the completion of the coating formation. The outer side of the V-shaped interface in the coating (also referred to as "outer side of the macroparticle portion") is a normal portion of the coating and has a uniform and smooth surface on which no repeating pattern is observed.

Figure 2:
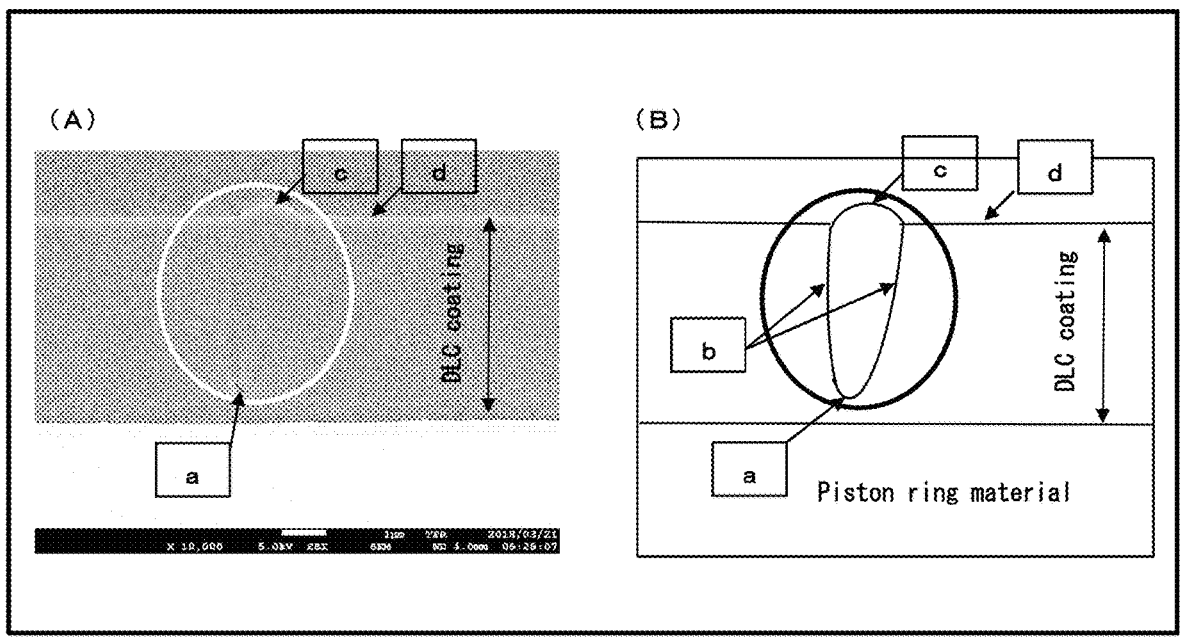
FIG. 2(A) shows a cross-sectional SEM image of the DLC coating produced in Example 3 (drawing substitute)
FIG. 2(B) is a schematic drawing for describing the macroparticle portion shown in FIG. 2(A).
Figure 3:
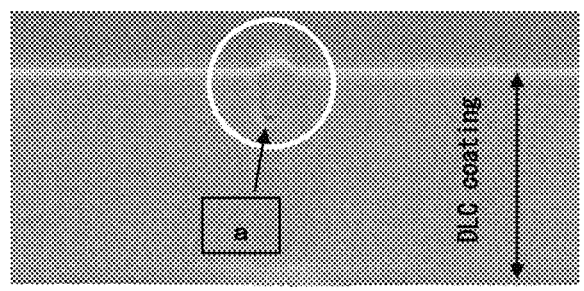
FIG. 3 shows another cross-sectional SEM image of the DLC coating produced in Example 3 (drawing substitute).

FIG. 3 is another example of a cross-sectional SEM image taken immediately after the formation of the DLC coating of an embodiment (the below-described Example 3). FIG. 3 shows a case where, as opposed to FIG. 2, a small macroparticle portion is formed in the late stage of the coating formation. Originating from a macroparticle (arrow a), a single V-shaped interface expanding toward the coating surface is formed inside the circled area in the center of the image, and a bump protruding to the outside is formed on the coating surface. The outer side of the V-shaped interface in the coating (also referred to as "outer side of the macroparticle portion") is a normal portion of the coating and has a uniform and smooth surface on which no repeating pattern is observed.

Figure 4:
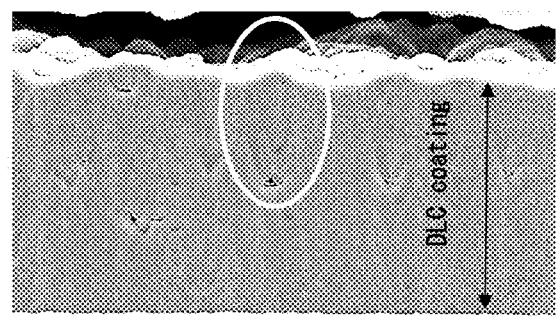
FIG. 4 shows a cross-sectional SEM image of the DLC coating produced in Comparative Example 1 (drawing substitute).

FIG. 4 shows one example of a cross-sectional SEM image taken immediately after the formation of a DLC coating of a conventional mode (the below-described Comparative Example 1). Originating from a macroparticle, two V-shaped interfaces expanding toward the coating surface are formed in an overlapping manner inside the circled area in the central of the image, and a large number of bumps protruding to the outside are formed on the coating surface. FIG. 4 is different from FIGS. 2 and 3 in that the V-shaped interfaces originating from the macroparticle are formed in both the thickness direction of the coating and the direction perpendicular thereto (the sliding direction of the piston ring) in an overlapping manner. In other words, the number of macroparticles that can be counted in the cross-sectional SEM image of the coating is large. Moreover, the coating surface shown in the SEM image of FIG. 4 has the largest irregularities among the coating surfaces shown in the SEM images of FIGS. 2, 3 and 5.

Figure 5:
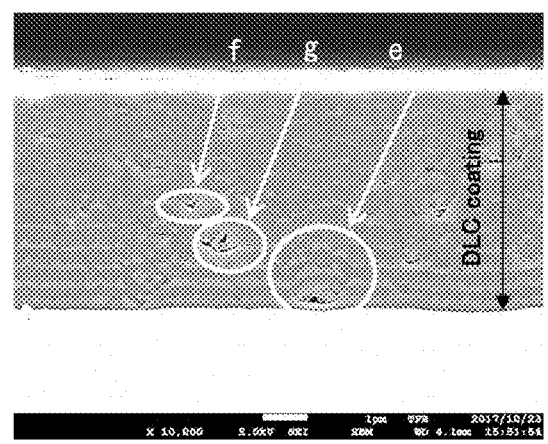
FIG. 5 shows a cross-sectional SEM image of the DLC coating produced in Comparative Example 2 (drawing substitute).

FIG. 5 shows another example of a cross-sectional SEM image taken immediately after the formation of a conventional DLC coating (the below-described Comparative Example 2). At the coating cross-section, a stripped pattern parallel to the coating thickness direction is formed on the side of the piston ring base material, and two different coating layers are laminated. In the circle indicated by e in FIG. 5, originating from a macroparticle, a single small V-shaped interface slightly extending toward the coating surface is formed; however, this interface has no effect on the coating surface.

In the circle indicated by f in FIG. 5, a macroparticle forms a relatively large single pit in the SEM image. When a macroparticle similar to this pit form is exposed on the outermost surface of the coating, it is believed that the macroparticle would appear as a pit even if it is observed from the coating surface side and form a surface irregularity.

In the circle indicated by g in FIG. 5, a macroparticle forms a plurality of relatively large pits in the SEM image. When a macroparticle similar to this pit form is exposed on the outermost surface of the coating, it is considered that the macroparticle would appear as plural pits even if it is observed from the coating surface side and greatly affects the attacking property on a cylinder bore.

Figure 6:
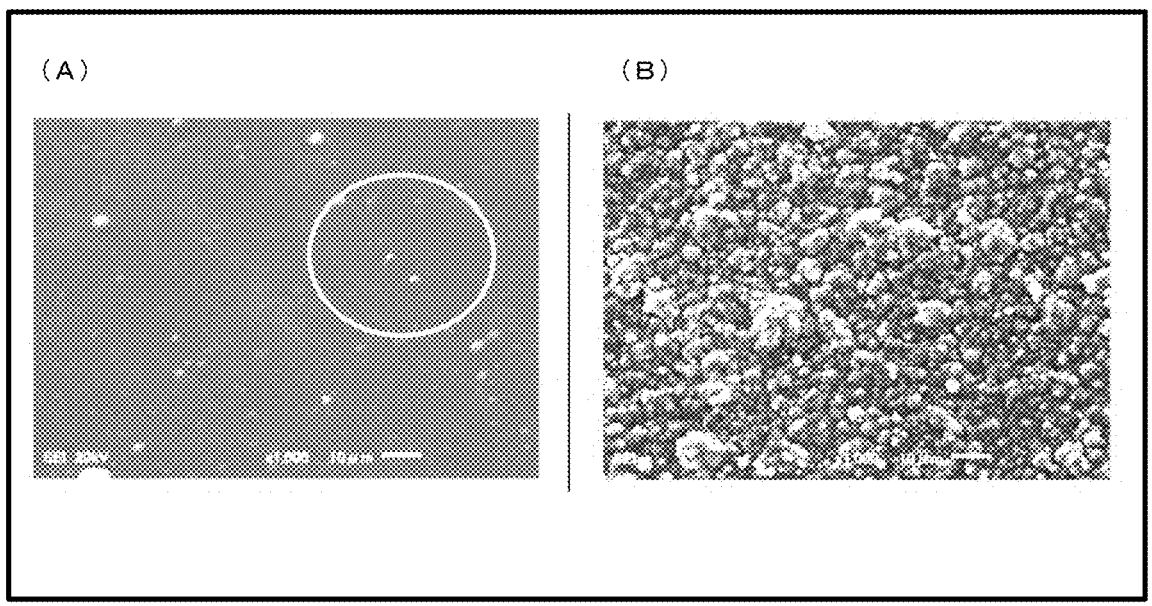
FIG. 6(A) shows a surface SEM image of the DLC coating produced in Example 3 (drawing substitute)
FIG. 6(B) shows a surface SEM image of the DLC coating produced in Comparative Example 1 (drawing substitute).

FIG. 6 shows surface SEM images taken at a magnification of ×1,000 immediately after the coating formation, which correspond to the cross-sectional SEM images of FIGS. 2 and 4 taken immediately after the DLC coating formation. FIG. 6(A) is a surface SEM image that was taken immediately after the formation of the DLC coating of the embodiment shown in FIG. 2 (the below-described Example 3). FIG. 6(B) is a surface SEM image that was taken immediately after the formation of the conventional DLC coating shown in FIG. 4 (the below-described Comparative Example 1).

Inside the circled area of the surface SEM image shown in FIG. 6(A), three relatively large bumps (dome-shaped white spots in the image) of 2 $\mu m$ to 3 $\mu m$ in diameter, which are formed by macroparticles and protrude on the surface, can be observed. According to this observation, it can be said that V-shaped interfaces at the coating cross-section are each formed in a conical shape inside the coating layer. In Patent Document 1, the density of droplets having a size of 300 μm² or larger (macroparticles of 20 μm or larger in diameter) on the coating surface is prescribed to be 600 droplets/mm² or less; however, in the present embodiment, even when macroparticles are present, their diameters are at a level of 5 μm or smaller.

Figure 7:
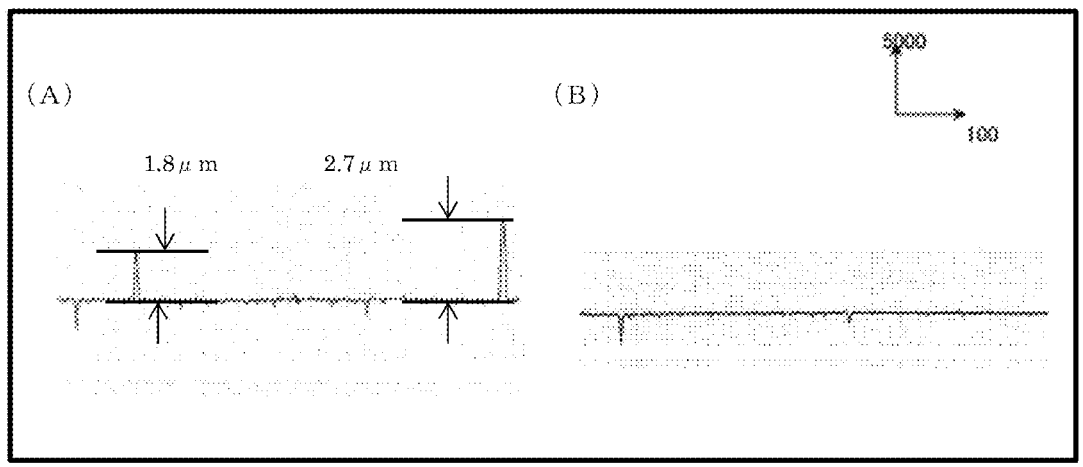
FIG. 7 shows surface roughness curves of the DLC coating produced in Example 3 (drawing substitutes), with FIG. 7(A) representing the state immediately after the coating formation and FIG. 7(B) representing the state of final finishing (surface smoothing).

FIG. 7(A) is a roughness curve of the surface of the DLC coating shown in FIG. 6(A), in which the measurement magnification is ×5,000 longitudinally and ×100 laterally. The peaks corresponding to bumps have a height at levels of 1.8 μm and 2.7 μm.

In the surface SEM image of FIG. 6(B), it can be observed that the bumps formed by macroparticles over the entire area are continuous. FIG. 7(B) is a roughness curve of the surface of the DLC coating shown in FIG. 6(B), in which the measurement magnification is ×5,000 longitudinally and ×100 laterally. The peaks corresponding to bumps form continuous irregularities in the roughness curve, and the maximum height Rz is at a level of 3.8 μm.

As shown in FIG. 7(B), the surfaces of the DLC coatings shown in FIGS. 2, 3 and 5 are each adjusted by surface smoothing as a final finishing process such that the surface roughness is 1.6 μm or less in terms of maximum height Rz and the roughness curve has a plateau shape.

Figure 8:
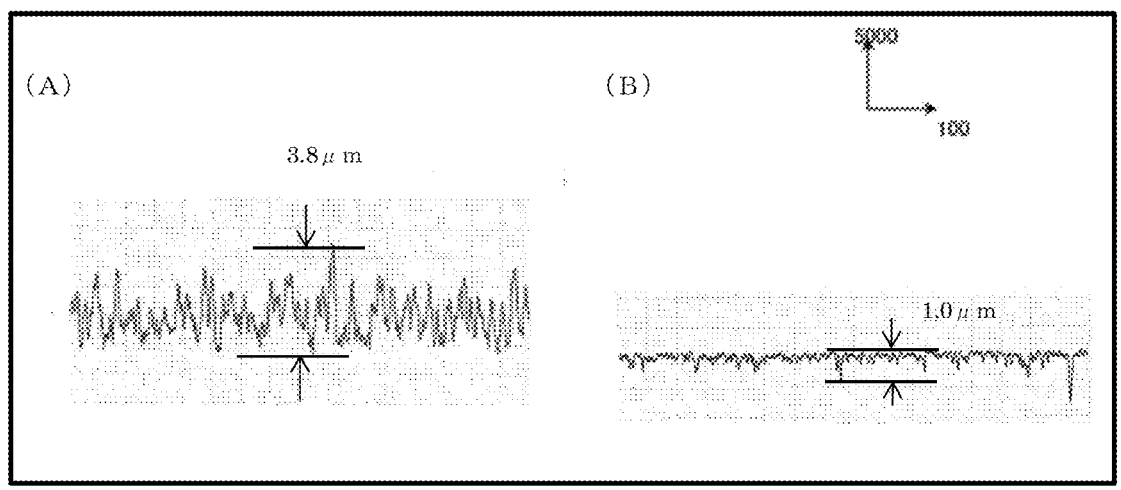
FIG. 8 shows a surface roughness curve of the DLC coating produced in Comparative Example 1 (drawing substitutes), with FIG. 8(A) representing the state immediately after the coating formation and FIG. 8(B) representing the state of final finishing (surface smoothing).

As shown in FIG. 8(B), the surface of the DLC coating shown in FIG. 4 is adjusted by surface smoothing as a final finishing process such that the surface roughness is 2.0 μm or less in terms of maximum height Rz and the roughness curve is rough.

In the surface smoothing, when a DLC coating has a large surface irregularities immediately after the formation thereof due to the presence of a large number of macroparticles as in the case of the conventional DLC coating (Comparative Example 1) shown in FIG. 8(A), irregularities are formed on the surface as shown in FIG. 8(B) even if surface smoothing is performed as a final finishing process; therefore, the present inventors consider that it is difficult to further smoothen the surface as shown in FIG. 7(B), and that the cylinder bore wear amount and the attacking property against counterpart members are consequently increased.

In the DLC coating of the present embodiment, the number of macroparticles existing at a cross-section is reduced; therefore, a smoother sliding surface can be formed as shown in FIG. 7(B), so that the attacking property against the cylinder bore material can be reduced.

[Measurement of Number of Macroparticles]

A method of measuring the number of macroparticles will now be described. The number of macroparticles is measured using an SEM (JSM-7001F, manufactured by JEOL Ltd.). In the circumferential direction of a single piston ring, the piston ring is cut at three spots which are at a position on the opposite side of a gap of the piston ring and at 90° positions relative to the gap on the respective sides. In ×10,000 SEM images of cross-sections perpendicular to the circumferential direction of the single piston ring, which images are extracted at the respective cutting positions, the number (n) of macroparticles existing in an enclosed region having a width of 10 μm in a direction perpendicular to the thickness direction of the coating and a depth of D μm from the coating surface in the thickness direction of the coating is counted. As a result, at one spot of each coating cross-section, the number (N) of macroparticles per unit area (macroparticles/μm²) is determined as $N=n/(10D)$. The number of macroparticles P is defined as the number of macroparticles per 10 μm², and an average of the values measured at the three spots of the single piston ring is calculated. The significance of this definition is that the number of macroparticles P can be compared regardless of the coating thickness. It is noted here that $P=n/D$ (macroparticles/10 μm²).

The coating cross-section in each of the ×10,000 cross-sectional SEM images can be observed for a portion having a maximum length of 8.5 μm in the longitudinal direction and a maximum length of 12 μm in the lateral direction, taking the thickness direction of the coating as the longitudinal direction.

In the present embodiment, in the ×10,000 cross-sectional SEM images, the value of P is preferably 2 (macroparticles/10 μm²) or less, more preferably 1.5 (macroparticles/10 μm²) or less.

A reduction in the number of macroparticles in the cross-sectional observation of the DLC coating indicates a reduction in the number of macroparticles existing on the coating surface, and the attacking property against the cylinder bore sliding surface is reduced by, for example, a reduction in the area per pit on the coating surface and a reduction in the number of pits.

The DLC coating of the present embodiment preferably has a refractive index of 2.3 to 2.6 at a wavelength of 550 nm as measured by a spectroscopic ellipsometer. By controlling the refractive index to be in this range, the DLC coating is made uniform, and the number of macroparticles therein is reduced. The refractive index may be 2.35 or higher, or 2.4 or higher.

[Measurement of Refractive Index]

As the spectroscopic ellipsometer for the measurement of refractive index, a spectroscopic ellipsometer UVISEL (manufactured by HORIBA, Ltd.) can be used.

As for the measurement conditions, the angle of incidence is 70°, and the spot is an ellipsoid having a minor axis of 1 mm and a major axis of 3 mm.

The measurement value is defined as an average of three measured values extracted from a coating cross-section at each of three spots along the circumferential direction of a single piston, which are at a position on the opposite side of a gap of the piston ring and at 90° positions relative to the gap on the respective sides.

The DLC coating preferably has a film thickness of 1 μm or greater, excluding the underlayer.

In the present embodiment, the DLC coating can be applied at a film thickness of at least 1 μm since the DLC coating itself has an improved wear resistance, and the film thickness is preferably 30 μm or less, more preferably 20 μm or less.

The DLC coating is mainly composed of amorphous carbon; however, the DLC coating may also contain hydrogen and other unavoidable impurities. The amount of hydrogen contained in the DLC coating is usually 5% by atom or less, and may be 3% by atom or less, 2% by atom or less, 1% by atom or less, or 0.5% by atom or less.

A method of producing the DLC coating of the present embodiment is not particularly restricted. As one example, a method of forming a coating by a filtered cathodic vacuum arc (FCVA) process may be employed. In the FCVA process, the DLC coating may be formed as a single structure, or may be formed as plural films with or without changing the pulse bias voltage to be applied. In the case of producing the DLC coating by a FCVA process, the pulse bias voltage to be applied is preferably larger than normal at, for example, −1,500 V to −3,000 V, preferably −2,000 V to −3,000 V.

EXAMPLES

The present invention will now be described in more detail by way of Examples and Comparative Examples. It is noted here, however, that the present invention is not restricted to the following Examples.

Example 1

With a piston ring base material being set in an apparatus, the apparatus was evacuated to reduce the pressure therein, and the base material was subsequently heated. Then, ion bombardment with argon ions was performed in a state where a pulse bias voltage in a range of −500 to −1,500 V was being applied to the base material.

Next, in an argon gas atmosphere, a bias voltage applied to the piston ring base material was set in a range of −50 V to −300 V, and a Ti coating was subsequently formed as an underlayer (adhesive layer) on the piston ring base material by a sputtering method.

Thereafter, on the thus formed Ti coating, a first amorphous carbon layer and a second amorphous carbon layer were alternately formed and laminated. In this process, the first amorphous carbon layer was formed by a sputtering method using a carbon target under an argon gas atmosphere in a state where a bias voltage in a range of −50 V to −300 V was being applied to the piston ring base material. Further, the second amorphous carbon layer was formed using a carbon target with arc discharge at a current of 50 to 200 A in a state where a pulse bias voltage in a range of −500 V to −1,500 V was being applied to the piston ring base material.

The formation of the first and the second amorphous carbon layers was carried out without using a hydrogen-containing process gas. Moreover, the thickness of the first amorphous carbon layer was set at 2 nm, and that of the second amorphous carbon layer was set at 398 nm. A set of one first amorphous carbon layer and one second amorphous carbon layer was repeatedly laminated in layers of 38 sets, and the resultant was subsequently subjected to surface smoothing as a final finishing process, whereby a 15 μm-thick DLC coating was obtained.

Example 2

A 10 μm-thick DLC coating was obtained in the same manner as in Example 1, except that the first amorphous carbon layer and the second amorphous carbon layer were repeatedly laminated in layers of 25 sets and the resultant was subsequently subjected to surface smoothing as a final finishing process.

Example 3

A Ti coating was formed as an underlayer on a piston ring base material in the same manner as in Example 1.

Subsequently, an amorphous carbon layer was formed on the Ti coating. This amorphous carbon layer was formed using a carbon target with arc discharge at a current of 50 to 200 A in a state where a pulse bias voltage in a range of −2,000 V to −3,000 V was being applied to the piston ring base material. The formation of the amorphous carbon layer was carried out without using a hydrogen-containing process gas. Moreover, the thickness of one amorphous carbon layer was set at 400 nm and this amorphous carbon layer was repeatedly laminated in 13 layers, after which the resultant was subjected to surface smoothing as a final finishing process, whereby a 5 μm-thick DLC coating was obtained.

Example 4

A 10 μm-thick DLC coating was obtained in the same manner as in Example 3, except that the thickness of one amorphous carbon layer was set at 400 nm and this amorphous carbon layer was repeatedly laminated in 25 layers, after which the resultant was subjected to surface smoothing as a final finishing process.

Comparative Example 1

With a piston ring base material being set in an arc ion plating apparatus, the apparatus was evacuated to reduce the pressure therein, and the base material was subsequently heated. Then, in a state where a bias voltage in a range of −500 V to −1,000 V was being applied to the base material, Cr ion bombardment was performed using a Cr target with arc discharge at a current of 50 A to 100 A.

Next, in a state where a bias voltage in a range of −10 to −100 V was being applied to the piston ring base material, a Cr coating was formed as an underlayer on the piston ring base material by arc ion plating using a Cr target with arc discharge at a current of 50 to 100 A.

Thereafter, an amorphous carbon layer was formed on the Cr coating. The formation of this amorphous carbon layer was carried out using a carbon target with arc discharge at a current of 50 A to 100 A in a state where a bias voltage in a range of 0 V to −100 V was being applied to the piston ring base material, and the resultant was subsequently subjected to surface smoothing as a final finishing process, whereby a DLC coating having an amorphous carbon layer thickness of 5 μm was obtained.

Comparative Example 2

With a piston ring base material being set in an arc ion plating apparatus, the apparatus was evacuated to reduce the pressure therein, and the piston ring base material was subsequently coated with a 10 μm-thick CrN layer. Then, a 0.2 μm-thick Cr intermediate layer was applied thereon. The resultant was, while being heated to 245° C. by a heater, subjected to 10-minute arc discharge at a bias voltage of −700 V and an arc current of 40 A and then to arc discharge at a bias voltage of −170 V and an arc current of 40 A, whereby a black amorphous carbon hard layer (high film density) and a white amorphous carbon hard layer (low film density) were formed at a total thickness of 0.5 μm, after which the resultant was once cooled to 125° C.

Subsequently, an adhesive layer made of white hard carbon was further formed by performing 90-second arc discharge at a bias voltage of −1,000 V and an arc current of 40 A. Thereafter, a heating-cooling cycle, which consisted of again performing arc discharge at a bias voltage of −170 V and an arc current of 40 A, heating the resultant to 245° C. using a heater and then forming a black hard layer and a white hard layer at a total thickness of 0.5 μm, was repeated eight times, after which the resultant was subjected to surface smoothing as a final finishing process, whereby a DLC coating having a total film thickness of 5 μm was formed.

Comparative Example 3

A Ti coating was formed as an underlayer on a piston ring base material in the same manner as in Example 1.

Subsequently, an amorphous carbon layer was formed on the Ti coating. This amorphous carbon layer was formed using a carbon target with arc discharge at a current of 50 to 200 A in a state where a pulse bias voltage in a range of −3,000 V to −3,500 V was being applied to the piston ring base material. The formation of the amorphous carbon layer was carried out without using a hydrogen-containing process gas. Further, the thickness of one amorphous carbon layer was set at 400 nm and this amorphous carbon layer was repeatedly laminated in 38 layers, after which the resultant was subjected to surface smoothing as a final finishing process, whereby a 15 μm-thick DLC coating was obtained.

Comparative Example 4

A Ti coating was formed as an underlayer on a piston ring base material in the same manner as in Example 1.

Subsequently, on this Ti coating, a first amorphous carbon layer and a second amorphous carbon layer were alternately formed and laminated. In this process, the first amorphous carbon layer was formed by a sputtering method using a carbon target under an argon gas atmosphere in a state where a bias voltage in a range of −50 V to −300 V was being applied to the piston ring base material. Further, the second amorphous carbon layer was formed using a carbon target with arc discharge at a current of 50 to 200 A in a state where a pulse bias voltage in a range of −100 V to −500 V was being applied to the piston ring base material.

The formation of the first and the second amorphous carbon layers was carried out without using a hydrogen-containing process gas. Moreover, the thickness of the first amorphous carbon layer was set at 2 nm, and that of the second amorphous carbon layer was set at 398 nm. A set of one first amorphous carbon layer and one second amorphous carbon layer was repeatedly laminated in layers of 13 sets, and the resultant was subsequently subjected to surface smoothing as a final finishing process, whereby a 5 μm-thick DLC coating was obtained.

Next, the above-obtained DLC coatings were evaluated. To begin with, a wear amount measurement test using a reciprocating friction wear tester was conducted as follows.

Figure 9:
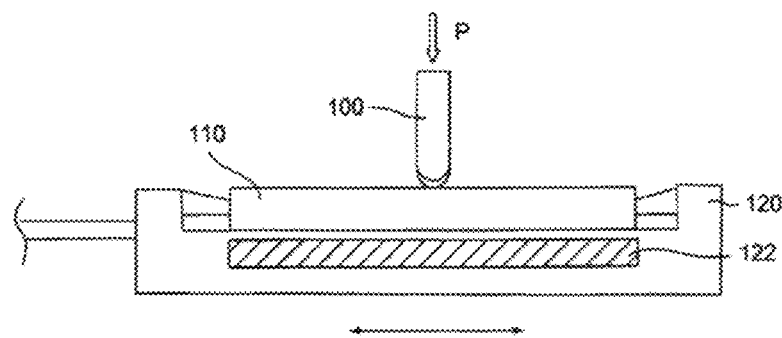
FIG. 9 is a schematic drawing that illustrates the outline of the reciprocating friction wear test conducted in Examples.

FIG. 9 shows the outline of a pin-on-plate type reciprocating friction wear test. First, using a martensitic stainless steel as a piston ring base material having a nominal diameter of 86 mm and a sliding-direction width of 1.2 mm, each DLC coating of the above-described Examples and Comparative Examples was formed on the outer peripheral surface of the base material to prepare a piston ring having a processed outer peripheral sliding surface. A piston ring member of 20 mm in circumferential length was cut out from each of three spots, which were at a position on the opposite side of a gap of the piston ring and at 90° positions relative to the gap on the respective sides, and then tested. The thus cut out piston ring members were subjected to final finishing such that the finished piston ring members had a surface roughness of 1.0 μm in terms of maximum height Rz with a plateau-shaped surface roughness curve, and these piston ring members were each used as upper test piece 100.

As a lower test piece 110 which was a material corresponding to JIS FC250, a plate imitating a cylinder bore made of flaky graphite cast iron having a hardness of HRB100 with carbide precipitation of 3% was prepared at a width of 17 mm, a length of 70 mm and a thickness of 14 mm, and subsequently subjected to final surface finishing with a #600 emery paper such that the finished plate had a surface roughness of 1.2 μm in terms of maximum height Rz.

The conditions of the wear amount measurement test are shown below. To the sliding surfaces of the upper test piece 100 and the lower test piece 110, 150 μl of an engine lubricating oil 0W-20, which had been used for 400 hours of actual engine operation, was supplied in a test period of 1 hour.

<Test Conditions>
Stroke: 50 mm
Load: 50 N
Rate: 300 cycles/min
Temperature of lower test piece: 80° C. (using a lower test piece heating heater 122)
Test period: 60 min For each of the DLC coatings obtained in Examples 1 to 4 and Comparative Examples 1 to 4, the $sp^2$ component ratio (%), the nanoindentation hardness, the Vickers hardness, the Young's modulus, the number of macroparticles P (/10 μm²), and the refractive index were measured. The measure values are shown in Table 1. Further, as the results of the reciprocating friction wear test, the frictional coefficient, the DLC coating wear ratio, the counterpart member wear ratio, the total wear ratio, and the wear amount evaluation are also shown in Table 1. It is noted here that the values of these results of the reciprocating friction wear test are each an average value of three trials. In the reciprocating friction wear test, the frictional coefficient was measured one minute after the start of the test. Further, the wear ratios in Examples and Comparative Examples were calculated taking the wear amount of the DLC coating of Comparative Example 1 as 50, the wear amount of the counterpart member as 50, and a total wear amount of as 100.

<Evaluation of Wear Amount>

The DLC coating wear ratio was 40 or lower, and the counterpart member wear ratio was 40 or lower: S The DLC coating wear ratio was 50 or lower, and the counterpart member wear ratio was 40 or lower: A The DLC coating wear ratio was 50 or lower, and the counterpart member wear ratio was higher than 40: B The DLC coating wear ratio was higher than 50, and the counterpart member wear ratio was 40 or lower: C The DLC coating wear ratio was higher than 50, and the counterpart member wear ratio was higher than 40: D

[Table 1]

TABLE 1

| | Coating property | | | | | | Result | | | |
|---|---|---|---|---|---|---|---|---|---|---|
| | $sp^2$ component ratio [%] | Hardness measured by nanoindentation method [GPa] | Vickers hardness [HV] | Young's modulus [GPa] | Number of Macro-particles P [/10 μm²] | Refractive index | Frictional coefficient | DLC coating wear ratio | Counterpart member wear ratio | Total wear ratio | Wear amount evaluation |
| Example 1 | 53 | 25.5 | 2000 | 248 | 2.00 | 2.326 | 0.087 | 46 | 33 | 79 | A |
| Example 2 | 62 | 21.2 | 1700 | 211 | 1.50 | 2.392 | 0.086 | 41 | 28 | 69 | A |

TABLE 1-continued

| | Coating property | | | | | | Result | | | |
|---|---|---|---|---|---|---|---|---|---|---|
| | | Hardness measured by nanoindentation method [GPa] | Vickers hardness [HV] | Young's modulus [GPa] | Number of Macroparticles P [/10 μm²] | Refractive index | Frictional coefficient | DLC coating wear ratio | Counterpart menber wear ratio | Total wear ratio | Wear amount evaluation |
| | sp² component ratio [%] | | | | | | | | | | |
| Example 3 | 72 | 17.9 | 1450 | 177 | 0.40 | 2.573 | 0.085 | 20 | 22 | 42 | S |
| Example 4 | 78 | 12.1 | 1000 | 120 | 1.90 | 2.367 | 0.092 | 36 | 32 | 68 | S |
| Comparative Example 1 | 30 | 36.5 | 2500 | 302 | 8.00 | 2.238 | 0.103 | 50 | 50 | 100 | B |
| Comparative Example 2 | 70 | 15.7 | 1300 | 202 | 5.40 | 2.281 | 0.100 | 43 | 53 | 96 | B |
| Comparative Example 3 | 85 | 11.4 | 950 | 111 | 1.80 | 2.384 | 0.105 | 51 | 35 | 86 | C |
| Comparative Example 4 | 42 | 31.2 | 2250 | 275 | 0.80 | 2.446 | 0.091 | 61 | 41 | 105 | C |

Note:
Results of reciprocating friction wear test is an average value of three trials As shown in Table 1, the frictional coefficient was 0.085 to 0.092 in Examples and 0.091 to 0.105 in Comparative Examples. Meanwhile, when a reciprocating friction wear test was separately conducted under a clean sliding environment using a new engine lubricating oil, the frictional coefficient was found to be at a level of about 0.06 in all of Examples and Comparative Examples. That is, the above-described friction wear test was conducted assuming an environment of after an extended operation, and it is believed that the frictional coefficient was high due to the occurrence of abrasive wear caused by the deposits that were generated inside the engine and contained in the used engine lubricating oil.

Further, an adhesion test was conducted to evaluate peeling of each DLC coating.

As for the test method, a conical diamond indenter used in the Rockwell hardness C-scale test according to JIS B2245:2016 was pushed against the surface of each DLC coating at a load of 150 kgf (1,471 N) and, after removing the load, the presence or absence of peeling of the coating around the thus formed impression was checked. The test was conducted three times for each DLC coating.

Figure 10:
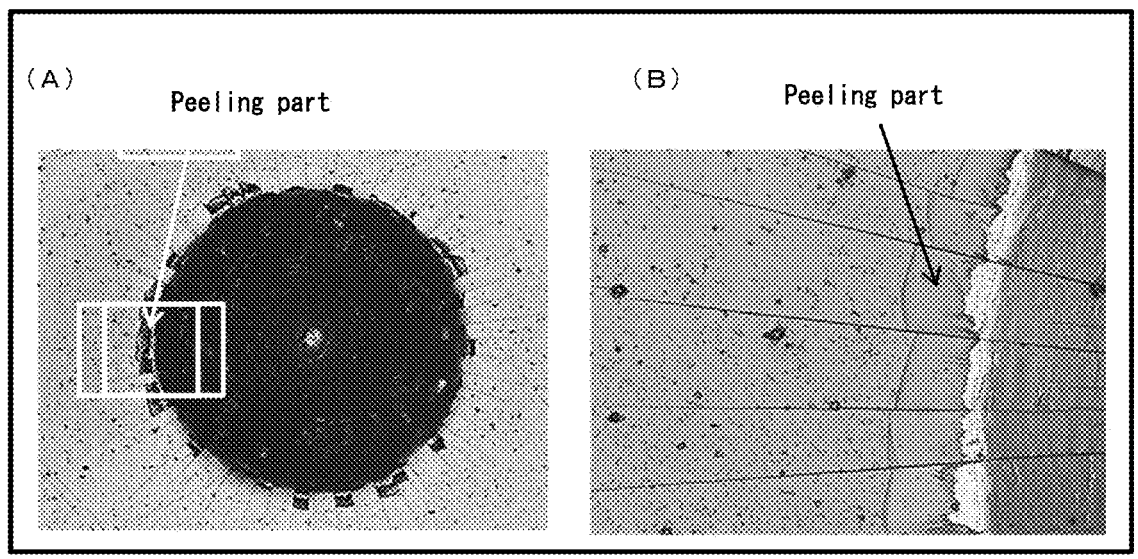
FIG. 10 provides laser micrographs showing peeling of a DLC coating in an adhesion test as a reference example (drawing substitute).

FIG. 10 provides laser micrographs that were taken in the above-described adhesion test and show the presence or absence of peeling of a DLC coating (drawing substitutes). FIG. 10(A) shows a laser micrograph of the coating surface that was taken at a magnification of ×200, and the circular black portion indicates an impression made by the indenter. FIG. 10(B) shows a laser micrograph of the coating surface that was taken at a magnification of ×1,000 and is an enlargement of the part surrounded by a square in FIG. 10(A), and the gray portion on the right side of the micrograph indicates an impression made by the indenter. As a laser microscope, VK-X150 manufactured by KEYENCE Corporation was used. As a result of the adhesion test, no peeling was found in all of Examples and Comparative Examples.

The above-described results of the wear test indicate the same tendencies as those of the sliding wear of piston rings and cylinder bores that are used in the actual engines on the market. The results show that the deposits generated inside the engine caused abrasive wear; and that larger values of the surface hardness and the Young's modulus resulted in greater wear of the DLC coatings themselves and greater wear of the counterpart member.

Furthermore, in those DLC coatings that contained a large number of macroparticles in a striped pattern at their cross-sections, many bumps were formed on the coating surface immediately after the production of each DLC coating, and these bumps were higher than 3 μm. Therefore, after the surface smoothing process, it tended to be difficult to obtain such a plateau-shaped smooth roughness curve with no observable peaks as shown in FIG. 7(B).

In those DLC coatings that contained a large number of macroparticles, since many pits (corresponding to the valleys of the roughness curve shown in FIG. 8(B)) were formed on the coating surface after the surface smoothing process, the wear amount of the counterpart member was increased and, at the same time, the wear of these DLC coatings was advanced.

DESCRIPTION OF SYMBOLS

10, 20: piston ring
11, 21: piston ring base material
12, 22: DLC coating
13, 23: underlayer
24: base layer
100: upper test piece
110: lower test piece
120: movable block
122: lower test piece heating heater

The invention claimed is:

1. A piston ring used in the presence of an engine lubricating oil, the piston ring comprising a DLC coating on an outer peripheral sliding surface, wherein an amount of hydrogen contained in the DLC coating is 5% by atom or less, and wherein the DLC coating has an sp² component ratio of 0.5 to 0.85 as measured by TEM-EELS using a transmission electron microscope (TEM) in combination with electron energy loss spectroscopy (EELS), as well as a coating hardness of 12 GPa to 26 GPa, a Young's modulus of 250 GPa or less as measured by a nanoindentation method, and a refractive index of 2.3 to 2.6 at a wavelength of 550 nm as measured by a spectroscopic ellipsometer.

2. The piston ring according to claim 1, wherein the DLC coating has a Young's modulus of 200 GPa or less.

3. The piston ring according to claim 1, wherein the number of macroparticles in the DLC coating, which is observed in a ×10,000 image of a cross-section of the DLC coating that is taken along a thickness direction under a scanning electron microscope (SEM), is 2 or less per 10 µm$^2$.

4. The piston ring according to claim 1, wherein the DLC coating has a coating hardness of 20 GPa or less.

5. The piston ring according to claim 1, wherein the DLC coating comprises an underlayer containing Ti, Cr, or Si.

6. The piston ring according to claim 1, wherein the DLC coating has a film thickness of 1 µm or greater.

7. A piston ring used in the presence of an engine lubricating oil, the piston ring comprising a DLC coating on an outer peripheral sliding surface, wherein a number of macroparticles in the DLC coating, which is observed in a ×10,000 image of a cross-section of the DLC coating that is taken along a thickness direction under a scanning electron microscope (SEM), is 2 or less per 10 µm$^2$, and the DLC coating has a Vickers hardness of 1,000 HV to 1,500 HV and a refractive index of 2.3 to 2.6 at a wavelength of 550 nm as measured by a spectroscopic ellipsometer.

* * * * *